(12) United States Patent
Wittenbreder

(10) Patent No.: US 6,462,963 B1
(45) Date of Patent: Oct. 8, 2002

(54) ZERO VOLTAGE SWITCHING POWER CONVERSION CIRCUITS

(75) Inventor: Ernest H. Wittenbreder, Flagstaff, AZ (US)

(73) Assignee: Technical Witts, Inc., Flagstaff, AZ (US)

(*) Notice: Subject to any disclaimer, the term of this patent is extended or adjusted under 35 U.S.C. 154(b) by 0 days.

(21) Appl. No.: 10/076,008

(22) Filed: Feb. 12, 2002

Related U.S. Application Data

(63) Continuation of application No. 09/956,711, filed on Sep. 19, 2001.

(51) Int. Cl.$^7$ ............................................. H02M 3/335
(52) U.S. Cl. ........................................ 363/16; 363/127
(58) Field of Search ............................. 363/16, 17, 59, 363/60, 127; 323/222, 224

(56) References Cited

U.S. PATENT DOCUMENTS

| | | | | |
|---|---|---|---|---|
| 5,402,329 A | * | 3/1995 | Wittenbreder, Jr. ........... | 363/16 |
| 6,051,961 A | * | 4/2000 | Jang et al. ................... | 323/224 |
| 6,101,108 A | * | 8/2000 | Wittenbreder, Jr. ........... | 363/65 |
| 6,169,668 B1 | * | 1/2001 | Clayton ........................ | 363/26 |
| 6,310,785 B1 | * | 10/2001 | Ayyanar et al. ............... | 363/17 |

\* cited by examiner

*Primary Examiner*—Adolf Denske Berhane

(57) ABSTRACT

A tapped inductor buck converter which achieves zero voltage switching and continuous input and output terminal currents is revealed. To achieve these results an additional switch, a small inductor, and a capacitor are required. The small inductor serves as a source of energy for driving the critical turn on transition of the main switch and the same small inductor also serves as a filter component for smoothing the input and output terminal currents. Simple adaptive gate drive circuits are revealed that improve the timing for turn on of zero voltage switches and reduce gate drive losses. A synchronous rectifier self drive mechanism is revealed which is universally applicable to zero voltage switching power converters with a single main switch which rely on an auxiliary inductor to drive the critical turn on transition of the single main switch. The wave form generated by the auxiliary inductor is ideally suited to synchronous rectifier self drive. Finally, peak current sensing techniques are revealed which are universally applicable to zero voltage switching power converters with a single main switch and an auxiliary switch which rely on an auxiliary inductor to drive the critical turn on transition of the single main switch. The current sensing techniques sense a winding voltage of the auxiliary inductor during the on time of the auxiliary switch. The winding voltage is directly related to the peak current in the main winding of the auxiliary inductor and the peak current in the single main switch of the power converter. The novel current sensing techniques are low noise, reliable, and lossless.

4 Claims, 9 Drawing Sheets

ZERO VOLTAGE SWITCHING POWER CONVERSION CIRCUITS

This application is a continuation of Ser. No. 09/956,711 filed Sep. 19, 2001.

BACKGROUND OF THE INVENTION

1. Field of the Invention

The subject invention generally pertains to electronic power conversion circuits, and more specifically to high frequency, switched mode power electronic converter circuits. The subject invention is a continuation of a pending patent whose Ser. No. is 09/956,711, filed Sep. 19, 2001.

2. Description of Related Art

For power converter applications that require large step down ratios, such as providing power to a microprocessor or DSP core, there are several possible solutions. In some cases an isolated converter form such as a forward converter is chosen so that the transformer can be used to provide the voltage step down and current step up. Compared to a simple buck converter the forward converter. or any other isolated converter type requires considerably more silicon for the same power losses. It is well known to those who are skilled in the art of power converter design that the component load factor for any isolated converter is four times that of a simple buck converter. The simple buck converter, or a synchronous rectifier buck converter, is often a better choice despite the large step down ratio issue. When a buck converter is chosen for a high step down ratio application the upper mosfet is chosen to be smaller than the lower mosfet since the duty cycle for the upper mosfet is small and the duty, cycle for the lower mosfet is large. Also the upper mosfet is chosen to have low gate drain capacitance so that it can switch fast to avoid the large turn on switching losses. Another option is a tapped inductor buck converter, as shown in FIG. 1. An alternate arrangement of the tapped inductor buck converter is shown in FIG. 2. The tapped inductor buck converter has the same low component load factor as the simple buck converter, but it, in effect, provides the step down ratio of a transformer isolated topology. The tapped inductor changes the buck converter in a couple of ways. The upper mosfet now sees a higher applied voltage and lower current and the lower mosfet now sees a lower applied voltage and higher current. The duty cycle of the lower mosfet is decreased and the duty cycle of the upper mosfet is increased. The net effect is that the component load factor is the same as the buck converter. There is a simple reason why the tapped inductor converter is not more popular. In the buck converter the output current is non-pulsating or continuous, although the input current of the buck converter is pulsating. For the tapped inductor buck converter both the input current and the output current are pulsating. What is needed is a tapped inductor buck converter that can achieve non-pulsating currents at both input and output terminals and elimination of first order switching losses.

Most soft switching or zero voltage switching (ZVS) converters require a brief dead time between operation of the switches to achieve zero voltage switching. The amount of dead time required is dependent on the current magnitudes and component values so that the chosen dead time is often close to the amount of dead time needed for a range of currents but often the fixed dead time results in additional losses because the switch is turned on too soon when there is applied voltage to the switch or too late after the switch body diode or other parallel diode has been conducting for a time and dissipating power at a rate greater than the switch would dissipate if it were turned on at the best possible time. What is needed is a simple gate circuit that senses the mosfet drain voltage and enables the mosfet at the instant when the drain source voltage drops to zero.

One significant source of power losses in high frequency power converters is gate drive loss. Some converters have the inherent ability to provide synchronous rectifier self drive which results in the recirculation of gate drive energy. What is needed is more synchronous rectifier self drive mechanisms for more converter topologies.

Another source of power losses is current sensing. Often a resistor is place in series with a high current path to accomplish current sensing. Often the resistor is made small in value and high in power dissipation ability. If the resistor is too small the signal can be noisy and additional circuits are often required to amplify the signal. Alternately, a current transformer circuit can be used, but these are relatively large and expensive and still require a significant amount of power dissipation in the high current winding of the current transformer. A circuit mechanism that has low noise and is low in power dissipation or lossless is needed.

OBJECTS AND ADVANTAGES

An object of the subject invention is to provide a ZVS cell that eliminates first order switching losses in all switches in a tapped inductor buck converter.

Another object of the subject invention is to provide a ZVS cell that also functions as an input and output filter to provide both continuous input terminal current and continuous output terminal current in a tapped inductor buck converter.

Another object of the subject invention is to provide a circuit mechanism that can accomplish optimal gate switching timing for switches that turn on at zero voltage.

Another object of the subject invention is to provide a simple self drive mechanism for the synchronous rectifier which recirculates rather than dissipates gate drive energy for the synchronous rectifier mosfet(s).

Another object of the subject invention is to provide a simple, reliable, and lossless current sense mechanism for high currents that does not require a resistor or transformer winding in the high current path.

Further objects and advantages of my invention will become apparent from a consideration of the drawings and ensuing description.

These and other objects of the invention are provided by novel circuit techniques that add a small inductor, an auxiliary switch, and a capacitor to achieve ZVS and continuous terminal currents for the tapped inductor buck converter. Optimal gate timing is provided for N channel mosfets by a simple circuit consisting of a small P channel mosfet and two rectifiers. Synchronous rectifier self drive is provided by coupling a capacitor to the same small inductor used to provide input and output filtering and drive energy for ZVS. The same circuit used to provide ZVS can be used as a base to provide a signal that is an analog to the peak inductor current.

SUMMARY

The subject invention uses a reset capacitor, an auxiliary switch, and a small inductor to accomplish ZVS in a tapped inductor buck converter and simultaneously to achieve non-pulsating input and output currents. Adaptive gate drive circuits are also revealed that achieve optimal switch timing of the power mosfets. Adaptive gate drive circuits for cascode mosfet composite switches are also revealed. A simple mechanism for providing synchronous rectifier self drive and recovery of synchronous rectifier gate drive energy is also revealed. Current sense mechanisms are revealed that do not require any circuit element in the high current path and, therefore, no current sense losses.

Description of the Preferred Embodiments

Figure 1:
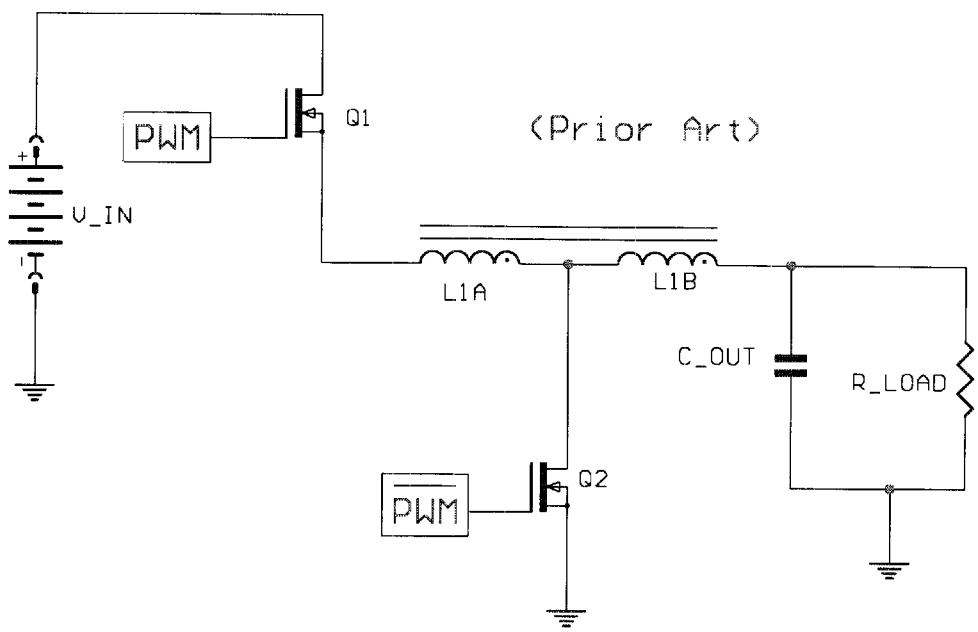
FIG. 1 illustrates a tapped inductor buck converter according to the prior art.
Figure 2:
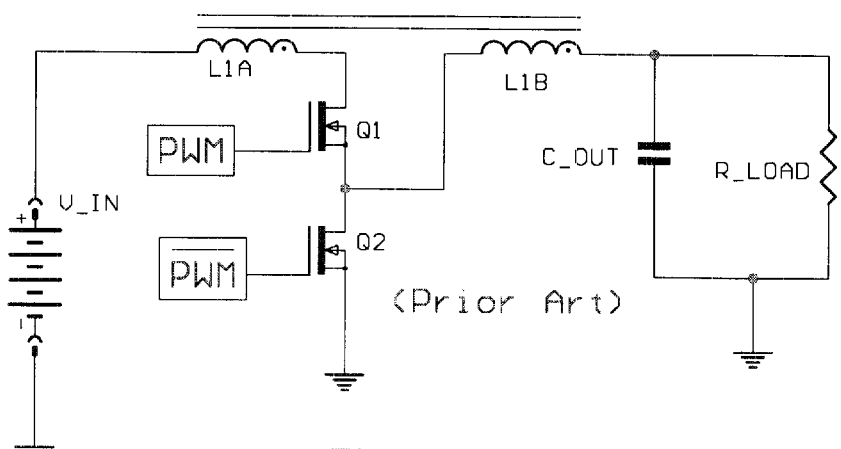
FIG. 2 illustrates an alternate arrangement of the tapped inductor buck converter according to the prior art.
Figure 3:
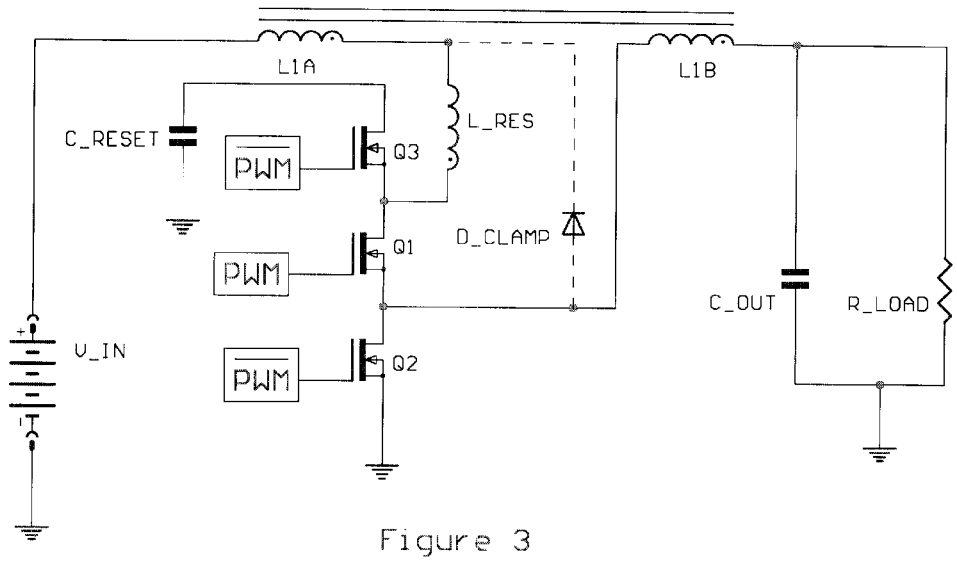
FIG. 3 illustrates a tapped inductor buck converter with ZVS and non-pulsating input current and output current according to the subject invention.

FIG. 3 illustrates the ZVS tapped inductor buck converter of the subject invention. In addition to achieving ZVS for all switches the converter also achieves non-pulsating or continuous input and output terminal currents. The FIG. 3 circuit uses a ZVS cell first revealed in a pending patent whose Ser. No. is 09/956,711. The ZVS cell comprises a main switch, an auxiliary switch, a small auxiliary inductor, and a capacitor. By substituting the ZVS cell for the main switch in a hard switching power converter circuit the new circuit with the new ZVS cell can achieve non-pulsating terminal currents and elimination of first order switching losses.

Figure 4:
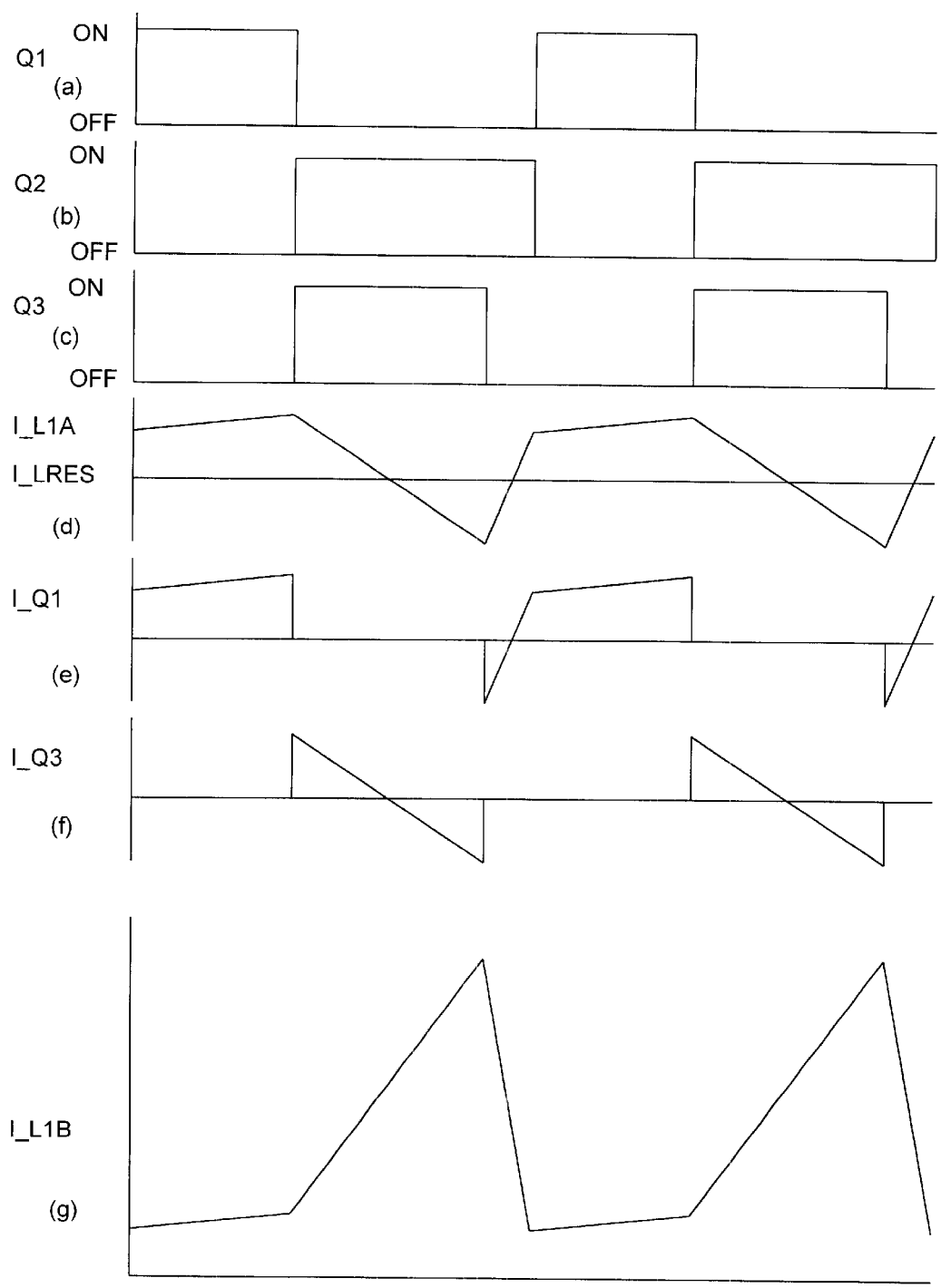
FIG. 4(a) illustrates the switch timing of the switch Q1 of FIG. 3.
FIG. 4(b) illustrates the switch timing of the switch Q2 of FIG. 3.
FIG. 4(c) illustrates the switch timing of the switch Q3 of FIG. 3.
FIG. 4(d) illustrates the current wave form of the inductor L__RES and the inductor winding L1A of FIG. 3.
FIG. 4(e) illustrates the current wave form of the switch Q1 of FIG. 3.
FIG. 4(f) illustrates the current wave form of the switch Q3 of FIG. 3.
FIG. 4(g) illustrates the current wave form of the inductor winding L1B of FIG. 3.
FIG. 4(h) illustrates the current wave form of the switch Q2 of FIG. 3.
FIG. 4(i) illustrates the voltage wave form of the inductor L1A of FIG. 3.
FIG. 4(j) illustrates the voltage wave form of the inductor L1B of FIG. 3.
FIG. 4(k) illustrates the voltage wave form of the inductor L__RES of FIG. 3.
FIG. 4(l) illustrates the voltage wave form of the switch Q1 of FIG. 3.
FIG. 4(m) illustrates the voltage wave form of the switch Q2 of FIG. 3.
Figure 4:
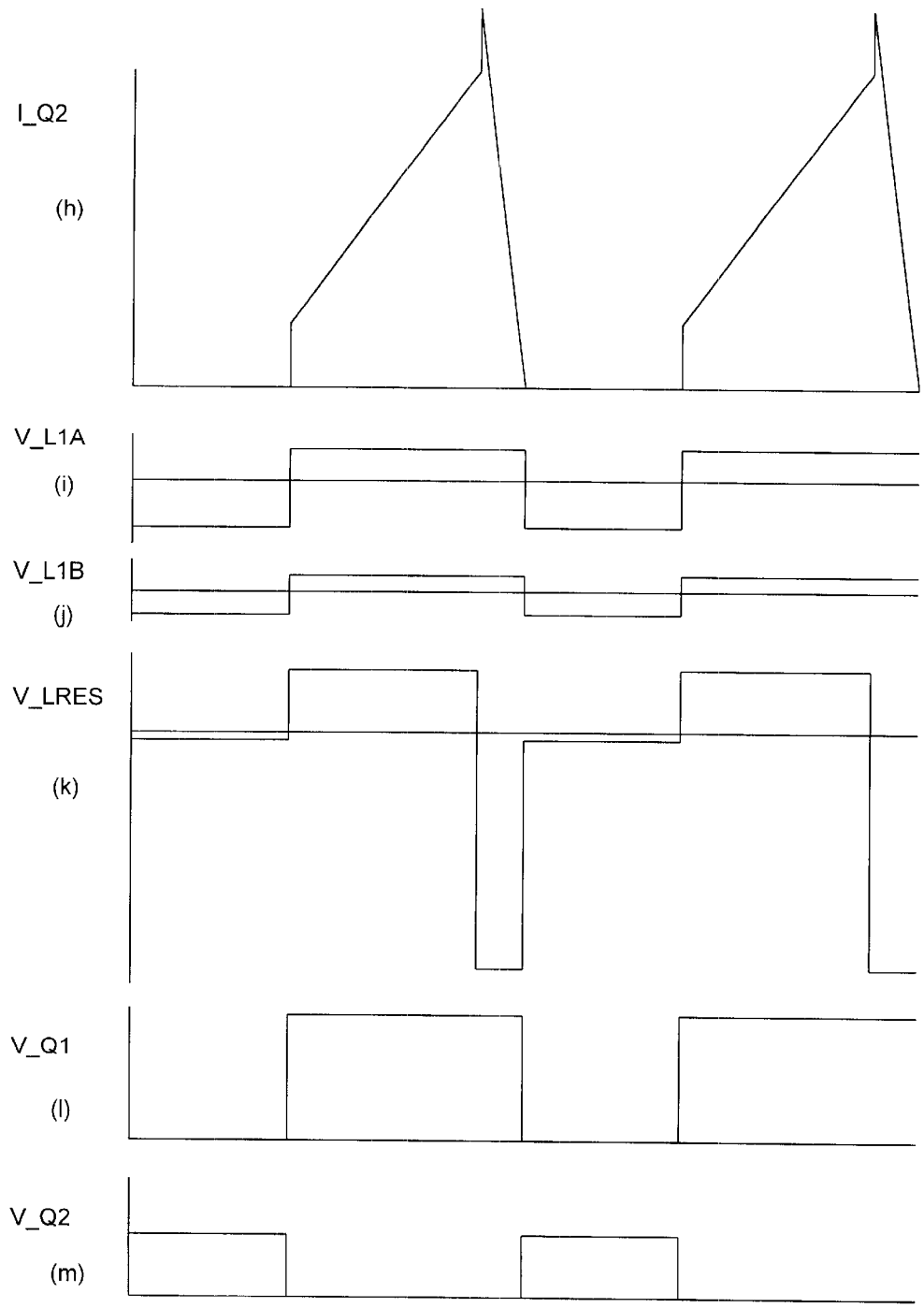

Referring to FIG. 3, during an initial condition and on state of the circuit, main switch Q1 is on and switches Q2 and Q3 are off, current flows from the source, V__IN, through the winding L1A, through the small auxiliary inductor, L__RES, through the switch Q1, through the winding L1B, to the output terminal and the load. During the Q1 switch on time, the current along the path described above ramps up or increases, as illustrated in FIG. 4(d). When the switch Q1 is turned off (opened), stored energy in the two magnetic elements forces the voltage across the switch Q1 to increase, until the body diodes of the synchronous rectifier switch Q2 and auxiliary switch Q3 begin to conduct, at which time the switches Q2 and Q3 can be turned on at zero voltage. The stored energy in the small inductor L__RES forces the current in the L1 coupled inductor to remain substantially unchanged through the turn off transition of the switch Q1, so that both the input and output terminal currents remain unchanged through the turn off transition of the switch Q1. During the on time of the switch Q3, the current in L1A and the small inductor L__RES, which is also the input terminal current, ramps down, as illustrated in FIG. 4(d), reverses sign, and ramps up in the opposite direction. During the on time of the switch the net charge into the capacitor C__RESET is zero, since charge flows into and out of the C__RESET capacitor in equal amounts. While the current in the L1A winding and the L__RES inductor are ramping down, the current in the L1B winding is ramping up by magnetic induction, since the windings L1A and L1B are mutually magnetically coupled. The current in the L1B winding is illustrated in FIG. 4(g). When the current in the L__RES inductor has reached a value equal in magnitude, but opposite in sign, to the value that it had when the Q3 switch was first turned on, the switch Q3 is turned off (opened). Now the current in the inductors, maintained by the stored energy in the inductor L__RES, forces the voltage across the switch Q3 to increase, and the voltage across the switch Q1 to decrease, until the body diode of the switch Q1 is turned on, at which time the channel of the switch Q1 can be turned on at zero voltage. The switch Q2 can also be turned off at this point, forcing the current in switch Q2 into its parallel body diode or into an external diode, parallel to the body diode, if one is provided. The voltage applied to the inductor L_RES is now quite large, as illustrated in FIG. 4(k), so that the current in the inductor L_RES falls quickly, reverses sign, and rises in magnitude, until the current in the windings L1A and L1B are once again equal to each other and equal to the current in the inductor L_RES, at which time the current in the switch Q2 is zero and the voltage across the switch Q2 begins to rise, as the voltage across the inductor L_RES rapidly falls in magnitude, at which point a full cycle has been completed, the initial condition is again in place, and the next cycle begins. During the entire cycle all of the switches were turned on and off at zero voltage and both the input terminal current and the output terminal current were continuous, i.e., non-pulsating, as illustrated in the figures.

Let $V_{RESET}$ be the voltage applied to the capacitor C_RESET, let $V_{OUT}$ be the output terminal voltage, let $V_{IN}$ be the input terminal voltage, let $I_{PEAK}$ be the peak current in the winding L1A, which is also the peak current in the main switch Q1, let $N_A$ be the number of turns in the L1A winding, let $N_B$ be the number of turns in the L1B winding, let T be the cycle period, and let $D_2$ be the duty cycle of the switch Q3. The voltage applied to the capacitor C_RESET is then $$V_{RESET} = V_{IN} + \frac{N_A}{N_B} \cdot V_{OUT} + 2 \cdot L_{RES} \cdot \frac{I_{PEAK}}{D_2 \cdot T}. \quad (1)$$

The second term in the equation (1) results from the fact that the voltage applied to the L1B winding is equal to the output voltage when the switch Q3 is on and the voltage applied to the L1A winding will be larger or smaller by a factor equal to the turns ratio. The third term is equal to the voltage applied to the L_RES inductor which is the voltage necessary to reverse the current in the L_RES inductor according to Faraday's Law.

Figure 5:
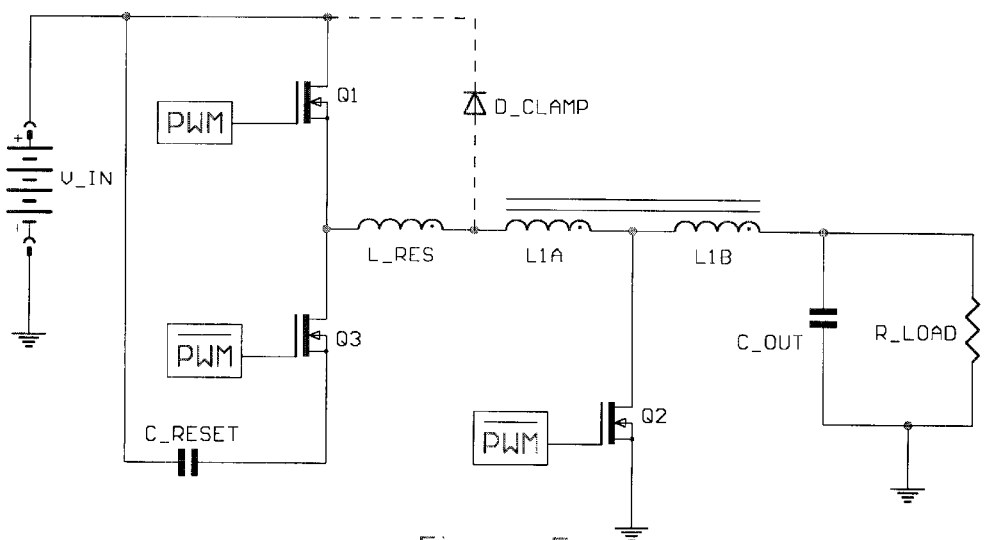
FIG. 5 illustrates an alternate arrangement of the subject invention which provides the same results as the FIG. 3 circuit.

FIG. 5 illustrates a related embodiment in which the circuit is slightly rearranged, but the wave forms and the results are the same. Both FIGS. 3 and 5 show an optional diode, D_CLAMP, which can be used to reduce ringing associated with the interaction of the inductor L_RES and the circuit's parasitic capacitances.

Figure 6:
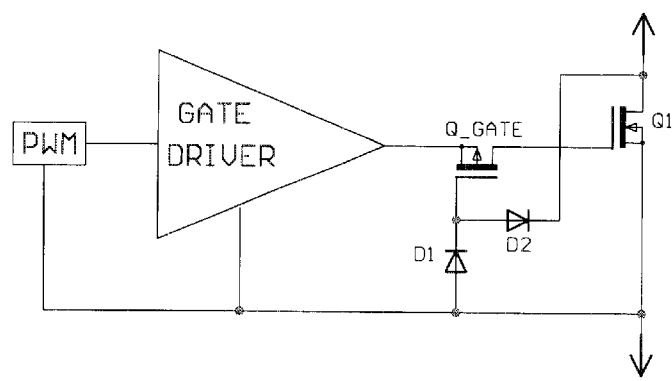
FIG. 6 illustrates an adaptive gate drive circuit that provides optimal switch timing for ZVS power mosfets according to the subject invention.

FIG. 6 illustrates an adaptive gate driver circuit that uses a small P channel mosfet, Q_GATE, and a pair of diodes, D1 and D2, to control the turn on timing of a N channel mosfet Q1. Let's assume that the N channel mosfet is off and its gate voltage is low. When the output of the gate driver rises, the source of Q_GATE rises, and also, the gate of Q_GATE rises, since the gate and source are AC coupled through the inherent gate source capacitance of Q_GATE and the diode D1 blocks the charging of the gate source capacitor. The P channel mosfet is not turned on until the drain of the N channel mosfet Q1 falls to the voltage level of its source, or when the applied voltage to the N channel mosfet Q1 is zero, as desired, to accomplish ZVS. During the turn off transition the gate driver output falls, discharging the gate of the N channel Q1 through the body diode of the P channel mosfet Q_GATE with no delay. This mechanism does not rely on a gate driver timing delay during the turn on transition, so that the actual gate delay will depend only on the time it takes for the applied voltage of the N channel mosfet to fall to zero.

Figure 7:
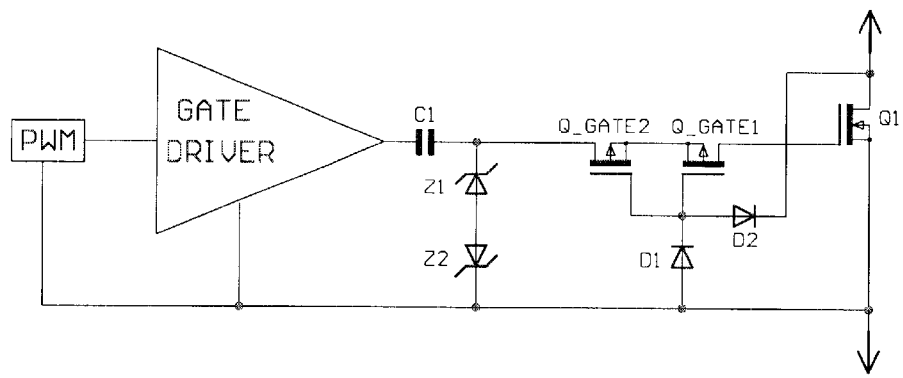
FIG. 7 illustrates an adaptive gate drive circuit that provides optimal switch timing and mosfet gate overvoltage protection according to the subject invention.

FIG. 7 illustrates a variation of the FIG. 6 circuit which employs a second P channel mosfet, a coupling capacitor, and a pair of zener diodes to clamp the voltage range applied to the P channel mosfets. The P channel mosfet Q_GATE1 operates the same as the Q_GATE mosfet of the FIG. 6 circuit. The Q_GATE2 P channel mosfet clamps the voltage at the source of the Q_GATE1 mosfet to a level near the source voltage of the N channel mosfet. During the turn on transition the body diode of the Q_GATE2 mosfet conducts and the channel of the Q_GATE2 mosfet turns on when the channel of the Q_GATE1 mosfet turns on. During the turn off transition as the sources of the two P channel mosfets approach the level of the source of the N channel mosfet, both of the mosfets turn off together. The voltage at the gates of the P channel mosfets is limited to one forward voltage drop of the D1 diode below the source voltage of the N channel mosfet. If the voltage at the drain of Q_GATE2 continues to fall below the voltage of the source of the N channel mosfet, the voltage appears across the Q_GATE2 mosfet while both the source and drain of the Q_GATE1 mosfet is maintained near the voltage level of the source of the N channel mosfet. The Q_GATE2 P channel mosfet provides gate breakdown voltage protection for the N channel mosfet Q1 in addition to minimizing the amount of gate charge required by the gate drive energy source.

Figure 8:
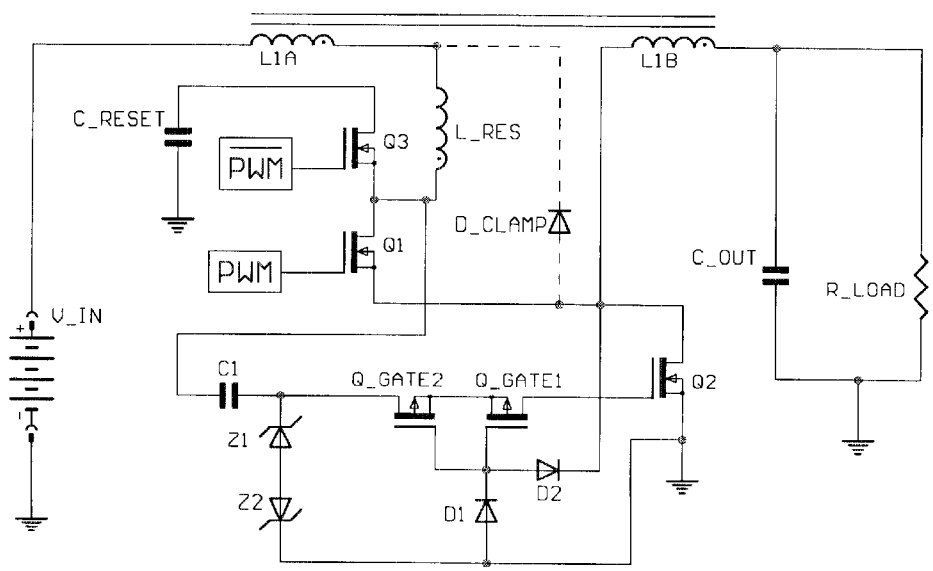
FIG. 8 illustrates a tapped inductor buck converter with synchronous rectifier self drive according to the subject invention.

FIG. 8 illustrates a synchronous rectifier self drive arrangement with adaptive gate drive timing for the Q2 synchronous rectifier mosfet in a circuit similar to the FIG. 3 circuit. The gate drive energy is provided by the small inductor L_RES coupled to the Q2 gate circuit by the capacitor C1 and to the adaptive gate driver, first illustrated in FIG. 7. Gate drive energy for the Q2 mosfet is provided by L_RES and the gate drive energy is returned to L_RES during the turn off transition of Q2. The timing of the gate drive signal provided by L_RES, illustrated in FIG. 4(k) is ideal for driving the synchronous rectifier, because the signal provides a rising edge for turning on the synchronous rectifier just after the main switch Q1 is turned off, and it provides a falling edge for turning off the synchronous rectifier just prior to the turn on of the main switch Q1, as desired. The use of the AC signal generated by the auxiliary inductor of the ZVS cell is a new technique that is universally applicable to all ZVS converters that use a single main switch and an auxiliary inductor to provide the drive energy for the turn on transition of the main switch. In FIG. 8 the application of the adaptive gate drive circuit illustrated in FIG. 7 is applied to just one of the three switches in the circuit of FIG. 8. The other two switches in FIG. 8 could also benefit from the use of the adaptive gate drive circuits of FIGS. 6 or 7, since both of these switches are switched at zero voltage.

Figure 9:
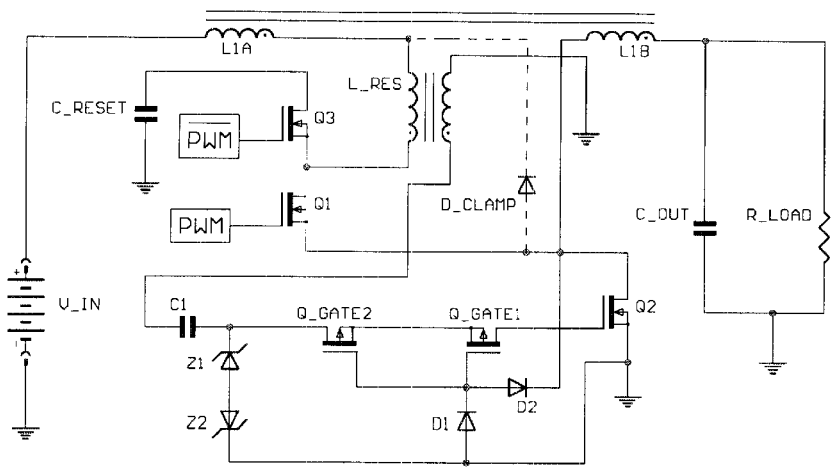
FIG. 9 illustrates a tapped inductor buck converter with synchronous rectifier self drive according to the subject invention.

FIG. 9 illustrates a variation of the FIG. 8 circuit in which the gate drive energy for Q2 is provided by a magnetically coupled winding added to the L_RES inductor. This secondary winding of L_RES enables voltage scaling of the drive signal for the synchronous rectifier Q2 and may enable the use of a smaller capacitor since the DC voltage of the L_RES side of the C1 capacitor is equal to V_IN in the FIG. 8 circuit and the L_RES side voltage of the C1 capacitor is zero or ground in the FIG. 9 circuit, so that the DC voltage applied to the coupling capacitor C1 may be lower for the FIG. 9 arrangement. The use of a secondary winding of the auxiliary inductor as a gate drive signal provides the same timing as the use of the primary winding since the two windings are mutually magnetically coupled. This technique is universally applicable to all ZVS converters that use a single main switch and a small auxiliary inductor to provide the drive energy for the critical turn on transition of the main switch.

Figure 10:
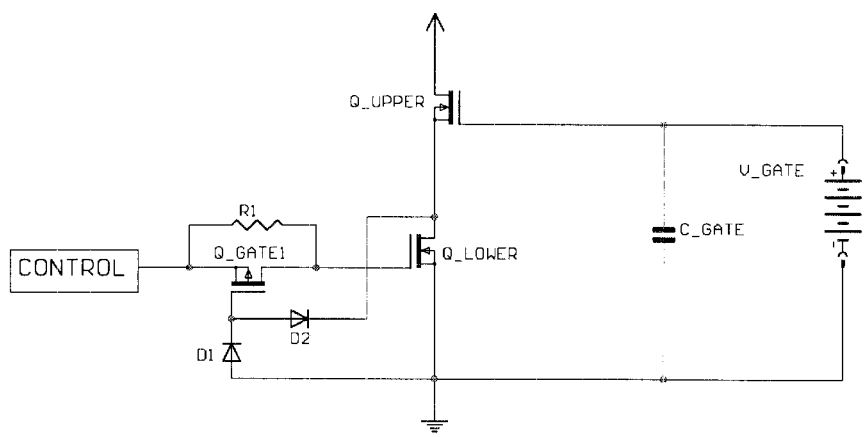
FIG. 10 illustrates a cascode composite mosfet switch with adaptive gate drive circuits for improved gate timing according to the subject invention.

FIG. 10 illustrates the application of the adaptive gate driver to the lower mosfet of a cascode mosfet composite switch. The cascode mosfet composite switch was first described in a pending patent whose Ser. No. is 09/970,365. The cascode switches of the composite switch comprise mosfet Q_LOWER as the lower switch and mosfet Q_UPPER as the upper switch. A P channel switch Q_GATE1 and two diodes are added to the gate circuit of the lower mosfet Q_LOWER of the cascode pair to accomplish optimal timing of the lower switch. A resistor is also added to the gate circuit of the lower mosfet which provides an upper limit to the gate timing delay provided by the P channel mosfet.

Figure 11:
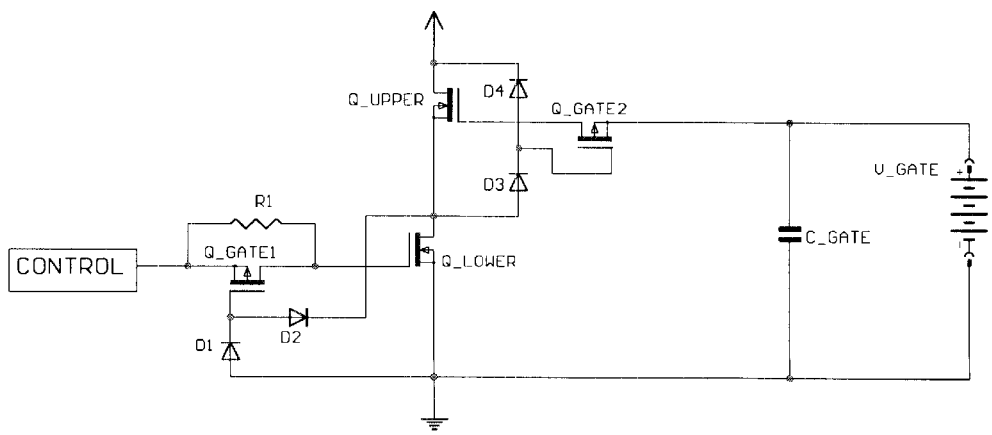
FIG. 11 illustrates a cascode composite mosfet switch with an optimal gate drive timing circuit according to the subject invention.

FIG. 11 shows the cascode composite switch with adaptive gate drive circuits added to the gates of both the lower mosfet Q_LOWER and the upper mosfet Q_UPPER. The additional gate drive circuits disable both of the N channel mosfets from turning on until their respective drain source voltages reach zero volts.

Figure 12:
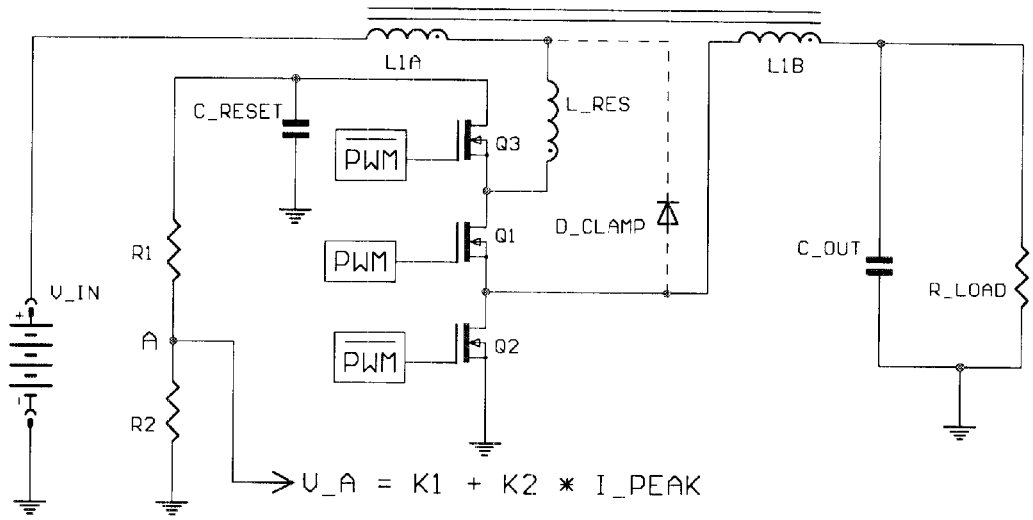
FIG. 12 illustrates a tapped inductor buck circuit with zero voltage switching and a peak current analog signal created from the reset capacitor voltage according to the subject invention.

FIG. 12 shows the FIG. 3 circuit with a resistive voltage divider added to provide a signal that varies with the peak current. According to equation (1) above the reset capacitor voltage will depend on the peak current. The reset capacitor voltage also depends on the input voltage, the output voltage, and the turns ratio of the coupled inductor L1. If the input voltage is confined to a narrow range and the output voltage is fixed and regulated then the resistive voltage divider sensing the reset capacitor voltage can provide a simple and reliable analog of the peak current in the main switch Q1.

Figure 13:
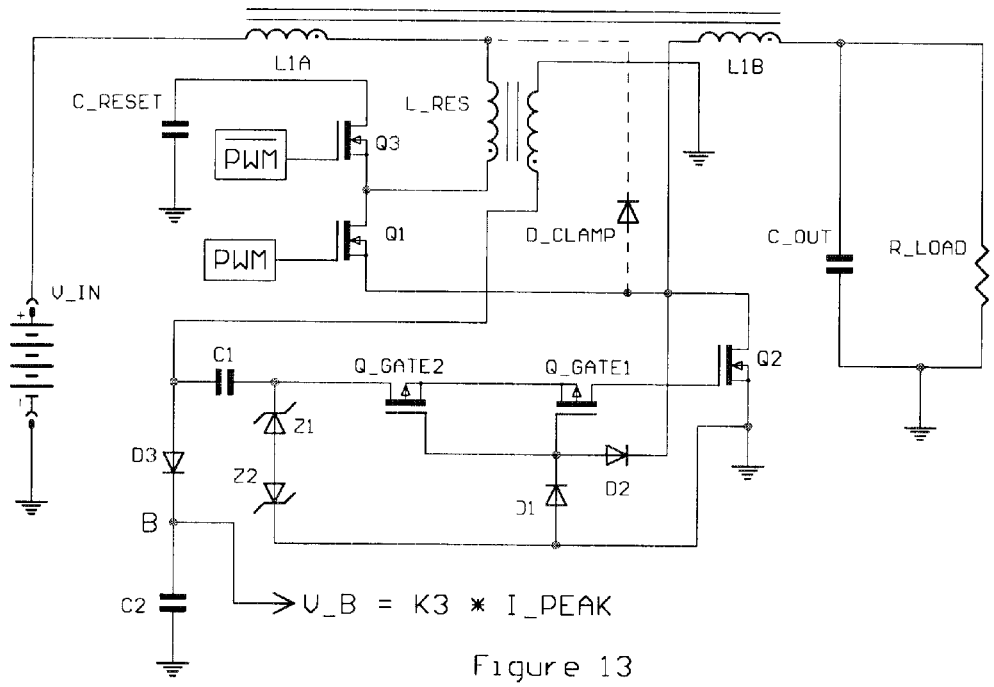
FIG. 13 illustrates a tapped inductor buck converter with a peak current analog signal created from an auxiliary inductor winding according to the subject invention.

FIG. 13 shows the FIG. 9 circuit with an extra diode D3 and capacitor C2. Assuming that the diode D2 is ideal the voltage on the capacitor C2 will be equal to the L_RES inductor voltage when the switch Q3 is turned on. More precisely, the C2 capacitor voltage is $$V_{C2} = 2 \cdot \frac{N_S}{N_P} \cdot L_{RES} \cdot \frac{I_{PEAK}}{D_2 \cdot T}, \qquad (2)$$

(where $V_{C2}$ is the applied voltage to the C2 capacitor, $N_S$ is the number of secondary turns of the L_RES coupled inductor, and $N_P$, is the number of primary turns of the L_RES coupled inductor. By sensing just the rectified winding voltage we have achieved a peak current analog that no longer has a direct dependence on input and output voltage and therefore is more reliable than the current sensing circuit revealed in FIG. 12. Equation (2) reveals that there is a $D_2$ dependence which indicates that there is still an indirect dependence of the peak current analog signal on the input and output voltages, since D2 varies with input and output voltage.

Figure 14:
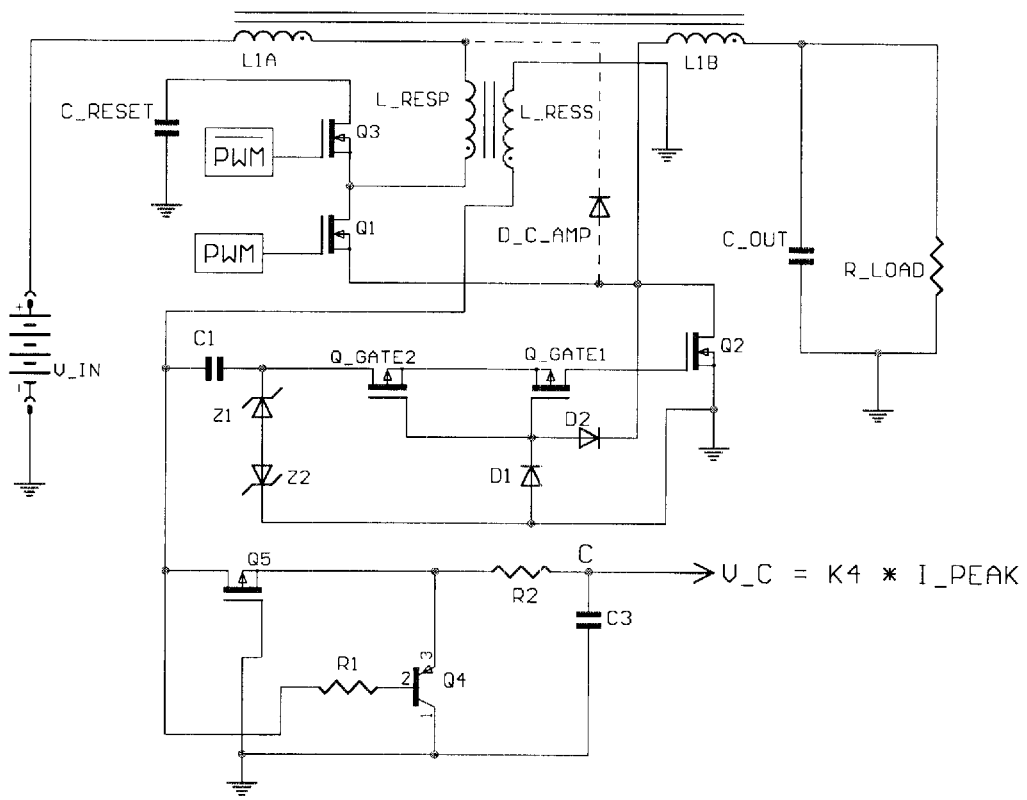
FIG. 14 illustrates a tapped inductor buck converter with a peak current analog signal created from an auxiliary inductor winding, rectifier, and an averaging circuit and a synchronous rectifier self drive circuit according to the subject invention.

FIG. 14 illustrates the circuit of FIG. 9 with a synchronous rectifier and low pass filter applied to the secondary winding of the L_RES inductor. The peak voltage of the L_RES secondary winding is given above in equation (2). The synchronous rectifiers, comprising transistors Q4 and Q5, apply the peak L_RES secondary winding voltage to the low pass filter, comprising resistor R2 and capacitor C3, for a time interval of $D_2 \cdot T$ during each cycle of operation. Or we can assert that the peak voltage given by equation (2) is applied to the low pass filter for a fraction of $D_2$ of the full operating cycle, and for the remainder of the cycle the voltage applied to the low pass filter is zero, so that the new peak current analog which appears at the capacitor C3 is a time average of the two applied voltages to the filter or $$V_{C3} = 2 \cdot \frac{N_S}{N_P} \cdot L_{RES} \cdot \frac{I_{PEAK}}{T} = D_2 \cdot V_{PEAK} = D_2 \cdot V_{C2}, \qquad (3)$$

where $V_{C3}$ is the voltage applied to the capacitor C3, and $V_{PEAK}$ is the L_RES winding voltage during the on time of the switch Q3, which is given by equation (2). Notice that the equation (3) has no duty cycle dependence so that we have achieved a very reliable peak current analog that has no direct or indirect dependence on input or output voltage. Equation (3) shows that the peak current analog depends only on the turns ratio of the coupled inductor L_RES, the switching period, and the inductance of the primary winding of the coupled inductor L_RES, all of which quantities are generally fixed in a given design. The circuits and current sensing techniques revealed in FIGS. 12, 13, and 14 are universally applicable to any soft switching power converter with a single main switch in which an auxiliary inductor is used as the mechanism to provide the magnetic stored energy necessary to drive the critical ZVS turn on transition of the single main switch.

The circuit of FIG. 14 reveals a tapped inductor buck converter with many innovations. The circuit achieves non-pulsating input and output terminal currents, ZVS, eliminating the first order switching losses of all of the power stage mosfets, synchronous rectifier self drive, eliminating secondary switching losses of the synchronous rectifier mosfet, optimal switch timing using an adaptive gate drive circuit that senses the drain source voltage of the mosfet, and a peak current analog signal that is low noise, has no undesirable dependencies, and adds no components to the power stage of the circuit. In the FIG. 14 circuit the auxiliary inductor L_RES is a multi-functional component, providing energy for driving the critical turn on transition for the main switch Q1, drive energy and timing for synchronous rectifier self drive, and L_RES also forms the basis for the lossless, low noise, peak current sensor circuit.

Figure 15:
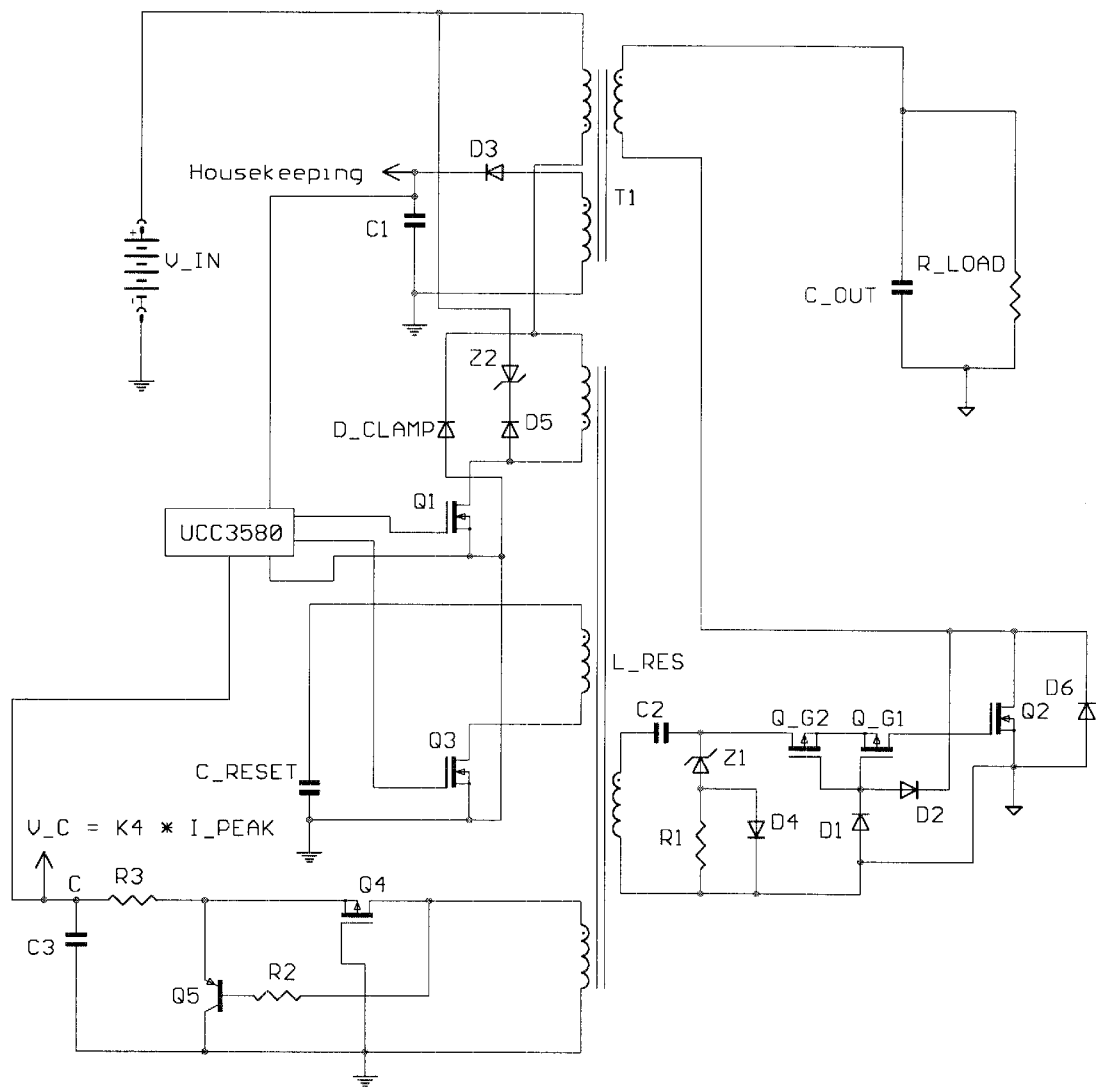
FIG. 15 illustrates a flyback converter which achieves ZVS, adaptive gate drive, synchronous rectifier self drive, and lossless peak current sensing using a rectifier and averaging circuit.

As an illustration of the fact that the techniques described above are universally applicable to any power converter that employs a single main switch and an auxiliary inductor to drive the turn on transition of the main switch, a flyback converter is presented in FIG. 15. In FIG. 15 T1 is the conventional flyback transformer, Q1 is the single main switch, and L_RES is the auxiliary inductor that provides the drive energy for the ZVS turn on transition of the single main switch Q1. The ZVS cell is described in a pending patent whose Ser. No. is 09/956,711. The circuit uses two low side primary switches, Q1 and Q3, and a low side synchronous rectifier, Q2, as the power stage switches. Q2 is self driven using the technique described above in the description of FIG. 9. The circuit uses the adaptive gate drive circuit described above and illustrated in FIG. 7 for optimal switch timing of Q2. The circuit also uses the peak current sensing technique described above for FIG. 14. As in the FIG. 14 circuit the L_RES inductor in the FIG. 15 circuit is a multi-functional component providing a mechanism for synchronous rectifier self drive, ZVS, and lossless peak current sensing.

Conclusion, Ramifications, and Scope of Invention

Thus the reader will see that the zero voltage switching cell of the invention provides both continuous input and output terminal currents and elimination of first order switching losses. The adaptive gate drive circuit provides optimal turn on timing for the zero voltage switches and in another embodiment limitation of the mosfet gate charge and gate voltage. The small inductor of the ZVS cell provides energy and optimal timing for synchronous rectifier self drive, and, with the addition of a few small signal circuit elements, an effective low noise and lossless peak current sensor.

While my above description contains many specificities, these should not be construed as limitations on the scope of the invention, but rather, as exemplifications or preferred embodiments thereof. Many other variations are possible. For example, different converter topologies that use the same ZVS cell to accomplish continuous terminal currents and elimination of first order switching losses, or different converter topologies that use an auxiliary inductor to both drive the ZVS turn on transition of the main switch and provide a signal for synchronous rectifier self drive, or different topologies that use a signal derived from an auxiliary inductor to form a peak current sensor in the manner revealed here for a tapped inductor buck converter. Accordingly, the scope of the invention should be determined not by the embodiments illustrated, but by the appended claims and their legal equivalents.

I claim:

1. A tapped inductor buck converter comprising
   an input coupleable to a source of DC potential,
   an output coupleable to a load,
   a first coupled inductor having a first winding and a second winding with said second winding connected to said output,
   a zero voltage switching cell connected to said first winding of said first coupled inductor and to said input comprising,
      a second inductor connected to said first winding of said first coupled inductor,
      first switch means connected to said second inductor,
      second switch means connected to said second inductor and to said first switch means operable substantially in anti-synchronization to said first switch means,
      a first capacitor connected to said second switch means and to said input,
      third switch means connected to said second winding of said first coupled inductor, to said output, and to said input operable substantially in anti-synchronization to said first switch means,
   whereby said zero voltage switching cell achieves elimination of first order switching losses of said first, said second, and said third switch means, and achieves both continuous input and continuous output terminal currents.

2. The tapped inductor buck converter of claim 1 further comprising,
   a first diode connected to said first winding of said first coupled inductor, to said first switch means, and to said second inductor,
   whereby said first diode provides clamping of ringing which results from interaction of said second inductor with parasitic capacitive elements in said tapped inductor buck converter.

3. A peak current sensing method applicable to a power converter that includes a zero voltage switching cell comprising,
   first single main pulse width modulated switch means,
   second auxiliary switch means connected to said first single main pulse width modulated switch means operable substantially in anti-synchronization to said first single main pulse width modulated switch means,
   a first inductor connected to said second auxiliary switch means and to said first single main pulse width modulated switch means,
   a first capacitor connected to said second auxiliary switch means,
   whereby said first capacitor together with said second auxiliary switch means provides a mechanism to reverse the peak current in a winding of said first inductor during an on time of said second auxiliary switch means for the purpose of driving a zero voltage turn on transition of said single main pulse width modulated switch means and peak current in a winding of said first inductor is determined by measuring a winding voltage of said first inductor during said on time of said second auxiliary switch means directly or indirectly by measuring the applied voltage to said first capacitor or indirectly by measuring the voltage of a secondary winding of said first inductor during the on time of said second auxiliary switch means in order to form a peak current analog electrical signal whose value is analogous to the value of the peak current in a winding of said first inductor and whereby said peak current analog electrical signal is obtained without placing an additional current sensing resistor or current sense transformer directly in the path of the peak current measured.

4. The method of claim 3 further comprising,
   a circuit that rectifies and averages a winding voltage of said first inductor during said on time of said second auxiliary switch means,
   thereby achieving a superior peak current analog electrical signal with no input voltage, output voltage, or duty cycle dependence.

* * * * *